United States Patent
Naik et al.

(10) Patent No.: US 10,002,834 B2
(45) Date of Patent: Jun. 19, 2018

(54) METHOD AND APPARATUS FOR PROTECTING METAL INTERCONNECT FROM HALOGEN BASED PRECURSORS

(71) Applicant: Applied Materials, Inc., Santa Clara, CA (US)

(72) Inventors: Mehul B. Naik, San Jose, CA (US); Paul F. Ma, Santa Clara, CA (US); Tae Hong Ha, San Jose, CA (US); Srinivas Guggilla, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days. days.

(21) Appl. No.: 14/711,135

(22) Filed: May 13, 2015

(65) Prior Publication Data

US 2016/0268207 A1 Sep. 15, 2016

Related U.S. Application Data

(60) Provisional application No. 62/131,742, filed on Mar. 11, 2015.

(51) Int. Cl.
*H01L 21/768* (2006.01)
*H01L 23/522* (2006.01)
(Continued)

(52) U.S. Cl.
CPC .. *H01L 23/53238* (2013.01); *H01L 21/28556* (2013.01); *H01L 21/76846* (2013.01)

(58) Field of Classification Search
CPC ......... H01L 21/02205; H01L 21/02208; H01L 39/2451; H01L 39/2477; H01L 2224/03426; H01L 2224/03824; H01L 2224/03829; H01L 2224/11426; H01L 2224/11824; H01L 2224/27426; H01L 2224/27824; H01L 2224/35824; H01L 21/02304; H01L 21/02362; H01L 21/76829; H01L 21/76841; H01L 21/28247; H01L 21/76885; H01L 23/53266; H01L 2221/1073; H01L 2224/80355; H01L 2224/85355; H01L 2224/8592; H01L 28/65; H01L 28/05176;
(Continued)

(56) References Cited

U.S. PATENT DOCUMENTS 6,133,136 A * 10/2000 Edelstein ............... H01L 24/05
257/750
6,139,700 A * 10/2000 Kang ...................... C23C 16/14
118/723 E (Continued)

OTHER PUBLICATIONS

PCT international search report and written opinion of PCT/US2016/015754 dated Apr. 29, 2016.

*Primary Examiner* — Daniel Whalen
(74) *Attorney, Agent, or Firm* — Patterson + Sheridan, LLP

(57) ABSTRACT

A method and apparatus for forming an interconnect on a substrate is provided. A protective layer is formed on the substrate and in a via formed on the substrate wherein the protective layer is resistant to a halogen containing material. A barrier layer is formed on top of the protective layer. The barrier layer comprises a halogen containing material. A metal layer is deposited over the barrier layer. In another embodiment, the protective layer is selectively deposited in the via.

20 Claims, 8 Drawing Sheets

(51) Int. Cl.
*H01L 23/532* (2006.01)
*H01L 21/285* (2006.01)

(58) Field of Classification Search
CPC . H01L 2224/05476; H01L 2224/05676; H01L 2224/05976; H01L 2224/13176; H01L 2224/13476; H01L 2224/13676; H01L 2224/13976; H01L 2224/29176; H01L 2224/29476; H01L 2224/29676; H01L 2224/29976; H01L 2224/37176; H01L 2224/37476; H01L 2224/37676; H01L 2924/01044; H01L 2924/01022; H01L 2924/01073; H01L 2924/01017; H01L 2924/01009; H01L 2224/05166; H01L 2224/05181; H01L 2224/05466; H01L 2224/05481; H01L 2224/05666; H01L 2224/05681; H01L 2224/05966; H01L 2224/05981; H01L 2224/13166; H01L 2224/13181; H01L 2224/13466; H01L 2224/13481; H01L 2224/13666; H01L 2224/13681; H01L 2224/13966; H01L 2224/13981; H01L 2224/29166; H01L 2224/29181; H01L 2224/29466; H01L 2224/29481; H01L 2224/29666; H01L 2224/29681; H01L 2224/29966; H01L 2224/29981; H01L 2224/37166; H01L 2224/37181; H01L 2224/37466; H01L 2224/37481; H01L 2224/37666; H01L 2224/37681; H01L 2224/37966; H01L 2224/37981; H01L 2224/45166; H01L 2224/45181; H01L 2224/45666; H01L 2224/45681; H01L 2224/43824; H01L 2224/81026; H01L 2224/83026
See application file for complete search history.

(56) References Cited

U.S. PATENT DOCUMENTS

| | | | |
|---|---|---|---|
| 6,372,633 | B1 | 4/2002 | Maydan et al. |
| 8,324,095 | B2 | 12/2012 | Chung et al. |
| 8,338,951 | B2* | 12/2012 | Jung ................ H01L 21/76843 257/751 |
| 2001/0022398 | A1 | 9/2001 | Grill et al. |
| 2003/0027427 | A1* | 2/2003 | Ma ................... H01L 21/76802 438/700 |
| 2003/0036263 | A1* | 2/2003 | Lin ................... H01L 21/28562 438/638 |
| 2003/0119325 | A1 | 6/2003 | Jeong et al. |
| 2003/0137058 | A1* | 7/2003 | Magerlein ............ H05K 1/112 257/784 |
| 2005/0042888 | A1* | 2/2005 | Roeder ..................... C07F 7/10 438/780 |
| 2005/0142862 | A1 | 6/2005 | Chun |
| 2005/0160575 | A1* | 7/2005 | Gambino ............ H01L 23/5227 29/602.1 |
| 2008/0085611 | A1* | 4/2008 | Khandelwal ...... H01L 21/28556 438/785 |
| 2008/0261412 | A1* | 10/2008 | Yoon ................. C23C 16/45551 438/785 |
| 2009/0045517 | A1 | 2/2009 | Sugiura et al. |
| 2009/0243098 | A1* | 10/2009 | Farooq .................... H01L 24/11 257/738 |
| 2010/0244252 | A1 | 9/2010 | Jezewski et al. |
| 2013/0093089 | A1* | 4/2013 | Yang ................. H01L 21/76846 257/751 |

* cited by examiner

METHOD AND APPARATUS FOR PROTECTING METAL INTERCONNECT FROM HALOGEN BASED PRECURSORS

CROSS-REFERENCE TO RELATED APPLICATIONS

This application claims priority from U.S. Provisional Application Ser. No. 62/131,742, filed Mar. 11, 2015, which is hereby incorporated by reference in its entirety.

BACKGROUND

Field

The present disclosure generally relates to a method and apparatus for forming interconnects and other conductive features in the fabrication of integrated circuits and other electronic devices. Specifically, the present disclosure relates to a method and apparatus for forming a protective layer resistant to halogen based precursors.

Description of the Related Art

As the structure size of integrated circuit (IC) devices is scaled down to sub-quarter micron dimensions, electrical resistance, and current densities have become an area for concern and improvement. Multilevel interconnect technology provides the conductive paths throughout an IC device, and are formed in high aspect ratio features including contacts, plugs, vias, lines, wires, and other features. A typical method for forming an interconnect on a substrate includes depositing one or more layers, etching at least one of the layer(s) to form one or more features, depositing a barrier layer in the feature(s), and depositing one or more layers to fill the feature. Typically, a feature is formed within a dielectric material disposed between a lower conductive layer and an upper conductive layer. The interconnect is formed within the feature to link the upper and lower conductive layers. Reliable formation of these interconnect features is important to the production of the circuits and the continued effort to increase circuit density and quality on individual substrates.

Copper is a choice metal for filling sub-micron high aspect ratio interconnect features because copper and its alloys have lower resisitivities than aluminum. However, copper diffuses more readily into surrounding materials and can after the electronic device characteristics of the adjacent layers. The diffused copper can form a conductive path between layers thereby reducing the reliability of the overall circuit and may even result in device failure. Hence, barrier layers are deposited prior to copper metallization to prevent or impede diffusion of copper atoms. Barrier layers typically are refractory metals such as tungsten, titanium, tantalum, and nitrides thereof, which all have a greater density than copper.

Halogen based precursors, such as chlorine and fluorine, aid in depositing a uniform barrier layer as compared to non-halogen based precursors. Halogen based precursors, however, may corrode the copper filling the high aspect ratio interconnect. This results in formation of various copper compounds that are difficult to remove from the substrate due to low volatility. Thus, the copper may corrode resulting in a reduction in reliability and loss of yield.

Therefore, there is a need to prevent adverse reaction between halogen based precursors and copper material comprising an interconnect.

SUMMARY

In one embodiment, a method of forming an interconnect on a substrate is disclosed herein. A protective layer is formed on a substrate and in a via formed on the substrate. The protective layer is resistant to a halogen containing material. A barrier layer is formed on the protective layer. The barrier layer comprises a halogen containing material. A blanket metal is deposited over the barrier layer.

In another embodiment, a method for forming an interconnect on a substrate is disclosed herein. A protective layer is selectively formed in a via formed on the substrate. The protective layer is resistant to a halogen containing material. A barrier layer is formed on the protective layer. The barrier layer comprises a halogen containing material. A blanket metal layer is deposited over the barrier layer.

In another embodiment, a method for forming an interconnect on a substrate is disclosed herein. A protective layer is formed on a via formed on a substrate. The protective layer is formed from ruthenium. A barrier layer is formed on the protective layer using a chlorine precursor. A liner layer is formed on the barrier layer. A blanket copper layer is deposited over the liner layer and fills the via.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
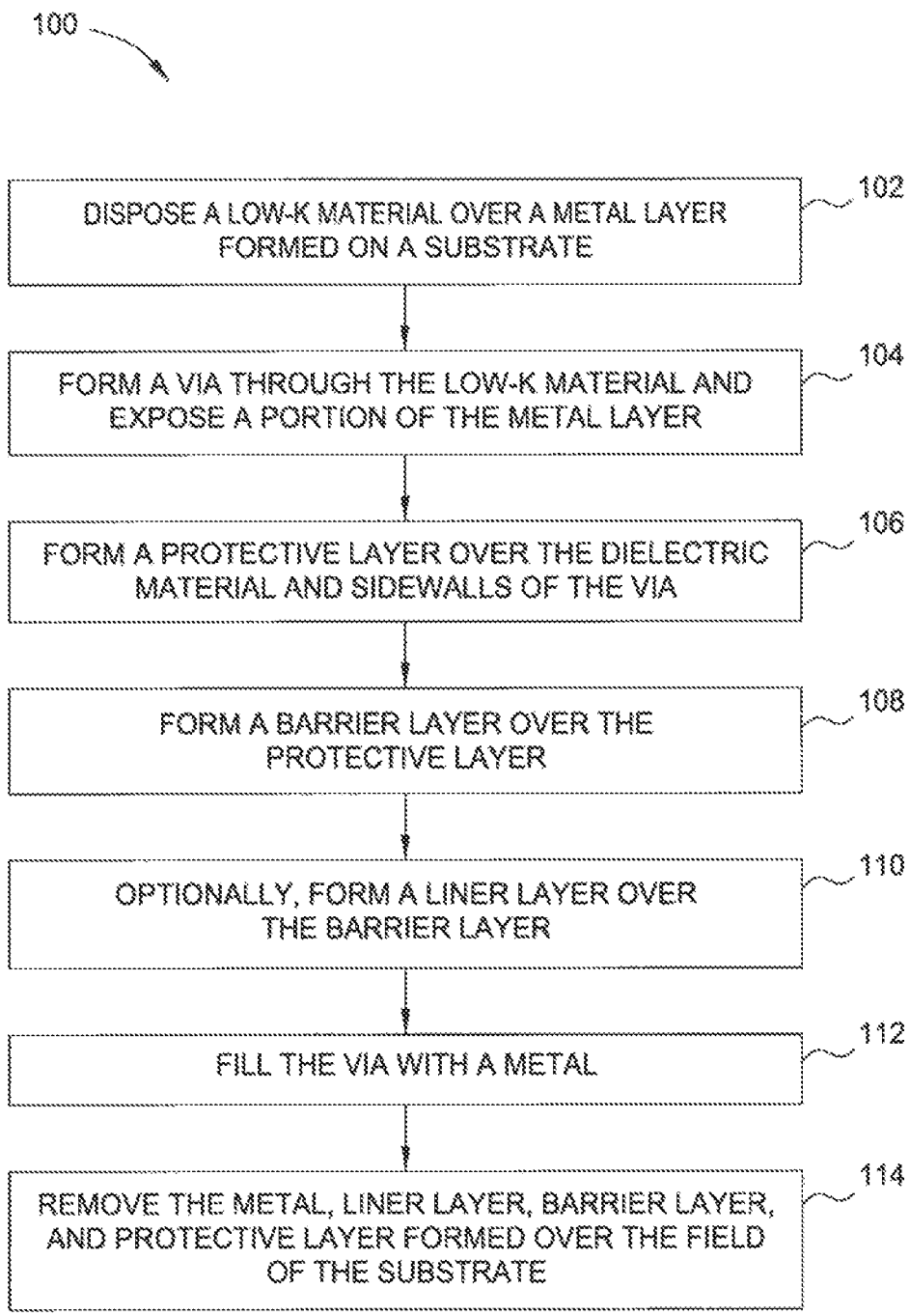
FIG. 1 illustrates one embodiment of a method for forming a metal interconnect on a substrate.
Figure 2A:
FIGS. 2A-2G illustrate cross-sectional views of a substrate at different stages of the method of FIG. 1.
Figure 2B:
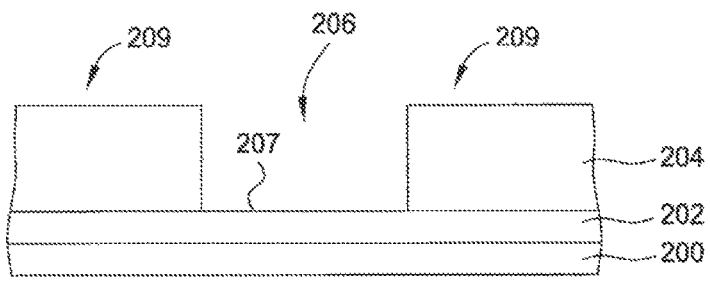

FIG. 1 illustrates one embodiment of a method 100 for forming a metal interconnect on a substrate. FIGS. 2A-2G illustrate cross-sectional views of a substrate at different stages of the method of FIG. 1. FIG. 2A depicts a substrate 200 having a metal layer 202 formed on the substrate 200. Method 100 begins at block 102 by disposing a dielectric material 204 on the metal layer 202 formed over the substrate 200, as shown in FIG. 2B. The dielectric material 204 may be made, for example, from a low dielectric constant material such as silicon oxide, fluorine doped silicon oxide, or carbon fluorine. At block 104, a via 206 is formed through the dielectric material 204, as shown in FIG. 2B. The via 206 extends from a top surface 205 of the dielectric material 204 to a top surface 207 of the metal layer 202 to expose the metal layer 202. The top surface 205 of the remaining dielectric material 204 defines a field 209 of the substrate 200.

Figure 2C:
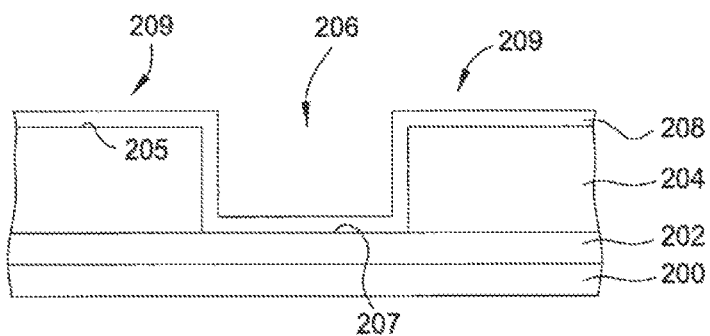

At block 106, a protective layer 208 is formed over the surface of the dielectric material 204 and in the via 206, as shown in FIG. 2C. The protective layer 208 may be deposited using a physical vapor deposition (PVD) process, an atomic layer deposition (ALD) process, a chemical vapor deposition (CVD) process, or other suitable processes. The protective layer 208 is made from a material that is resistant to a halogen containing material. Such suitable materials include, but are not limited to, ruthenium (Ru), titanium nitride (TiN), tantalum nitride (TaN), or ruthenium titanium nitride (RuTiN). The protective layer 208 acts as a barrier to prevent reaction between a halogen containing material and the underlying metal layer 202.

Figure 2D:
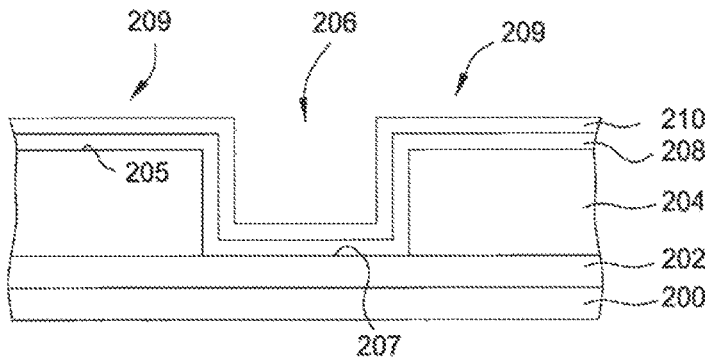

At block 108, a barrier layer 210 is deposited over the surface of the protective layer 208, as shown in FIG. 2D. The barrier layer 210 may be deposited using PVD, ALD, CVD, or other suitable processes. The barrier layer 210 may be deposited by using a halogen containing precursor, such as a chlorine containing precursor or a fluorine containing precursor. The halogen containing precursors are used to deposit the barrier layer 210, such as, but not limited to, tantalum (Ta), TaN, or alloyed Ta (e.g. TiTa, TaAl). The barrier layer 210 prevents diffusion of a metal into the surrounding dielectric material 204. The barrier layer 210 also provides an adhesive layer on the surrounding dielectric material 204 onto which the metal can be deposited.

Figure 2E:
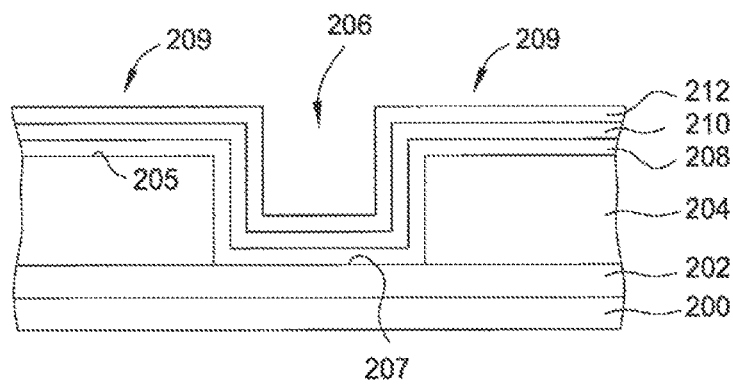

At block 110, an optional liner layer 212 may be deposited over the surface of the barrier layer 210, as shown in FIG. 2E. The liner layer 212 may be deposited using PVD, ALD, CVD, or other suitable processes. Additionally, the liner layer 212 may be deposited in the same chamber as the barrier layer 210. The liner layer 212 may be copper, ruthenium, or any other suitable material.

Figure 2F:
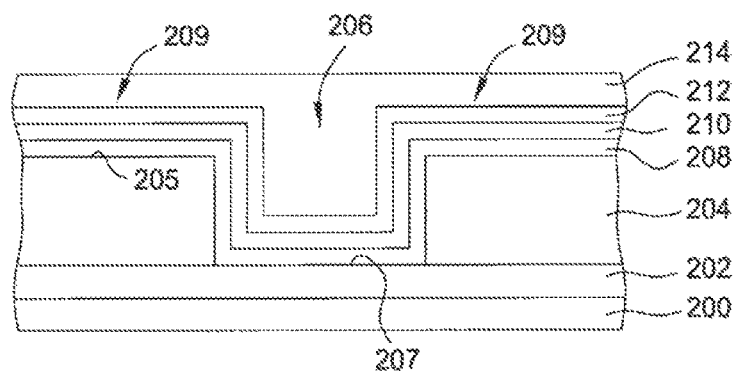

At block 112, the via 206 is filled with a metal 214, as illustrated in FIG. 2F. The metal 214 may be deposited in the via 206 by PVD, ALD, CVD, or other suitable processes. The metal 214 may be a conductive material, such as, but not limited to, copper (Cu) or cobalt (Co).

Figure 2G:
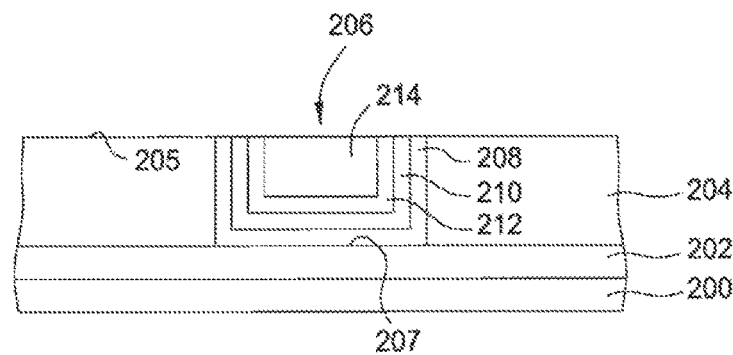

At block 114, the portion of the metal 214, which is formed over the field 209 of the substrate 200 may be removed using either chemical mechanical polishing, as shown in FIG. 2G. The metal filled via 206 remains with the liner layer 212, the barrier layer 210, and the protective layer 208 formed between the metal 214 and the metal layer 202, following removal of the metal 214 from the field 209 above the dielectric material 204.

Figure 3:
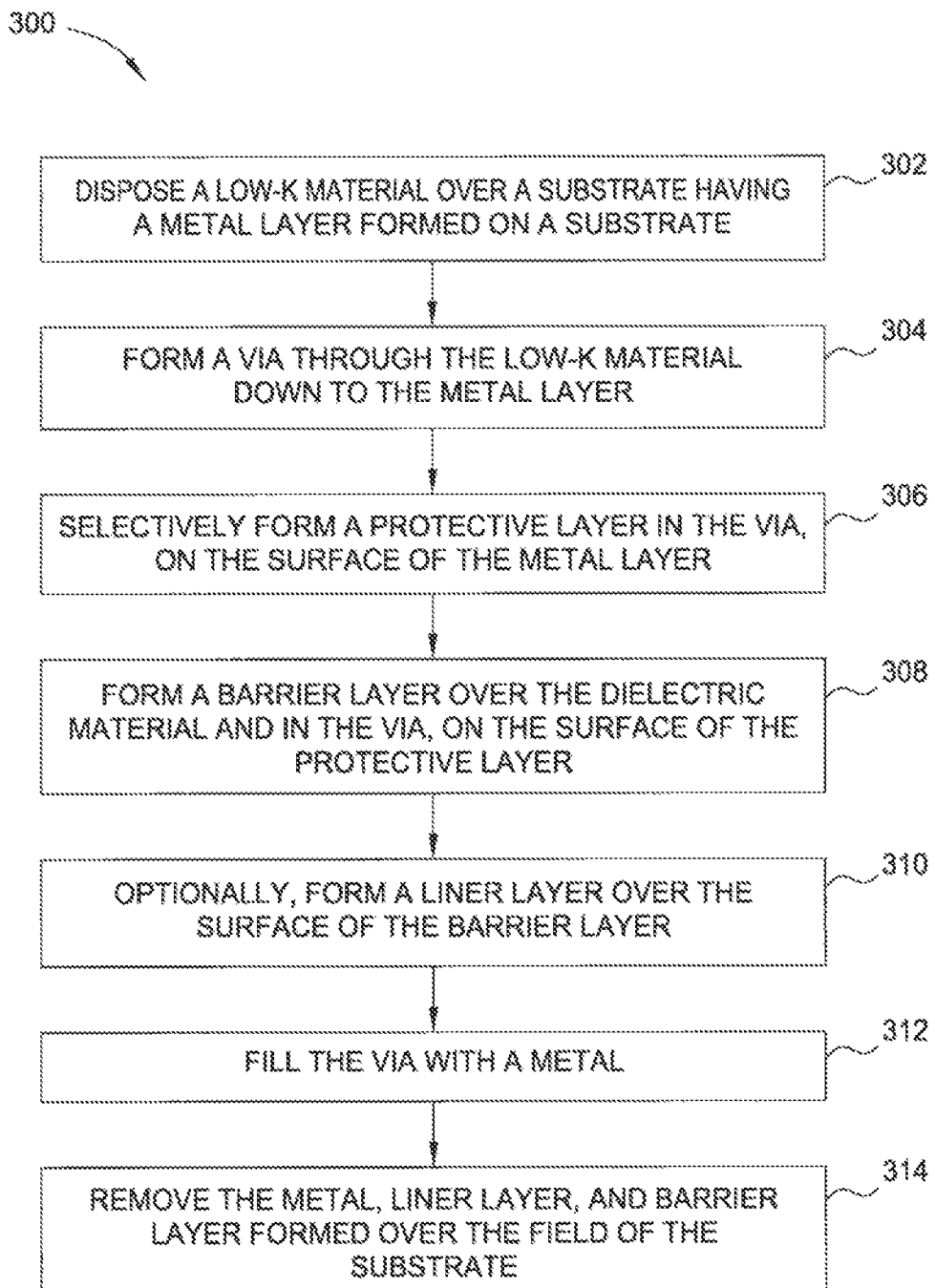
FIG. 3 illustrates one embodiment of a method for forming a metal interconnect on a substrate.
Figure 4A:
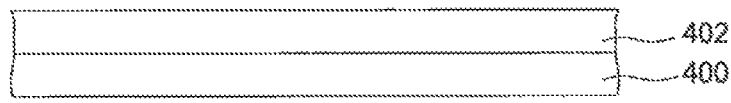
FIGS. 4A-4G illustrate cross-sectional views of a substrate at different stages of the method of FIG. 3.
Figure 4B:
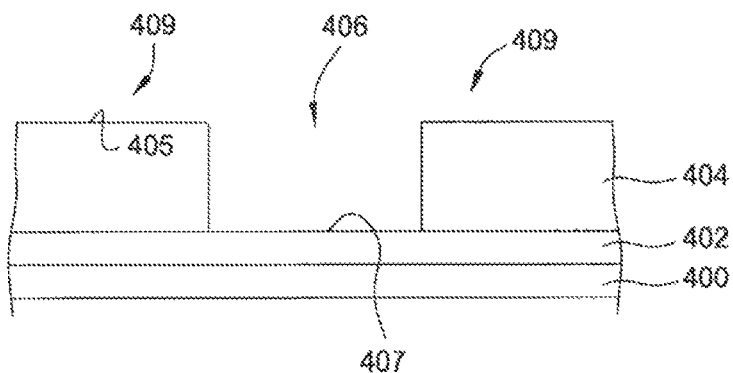

FIG. 3 illustrates another embodiment of a method 300 for forming a metal interconnect over a substrate. FIGS. 4A-4G illustrate cross-sectional views of a substrate at different stages of the method of FIG. 3. FIG. 4A depicts a substrate 400 having a metal layer 402 formed on the substrate 400. Method 300 begins at block 302 by disposing a dielectric material 404 on the metal layer 402 formed over the substrate 400, as shown in FIG. 4B. The dielectric material 404 may be made, for example, from a low dielectric constant material such as carbon-containing silicon oxides (SiOC), such as Black Diamond® and Black Diamond® II available from Applied Materials, Inc., of Santa Clara, Calif. At block 304, a via 406 is formed through the dielectric material 404, as shown in FIG. 4B. The via 406 extends from a top surface 405 of the dielectric material 404 to a top surface 407 of the metal layer 402 to expose the metal layer 402. The top surface 405 of the remaining dielectric material 404 defines a field 409 of the substrate 400.

Figure 4C:
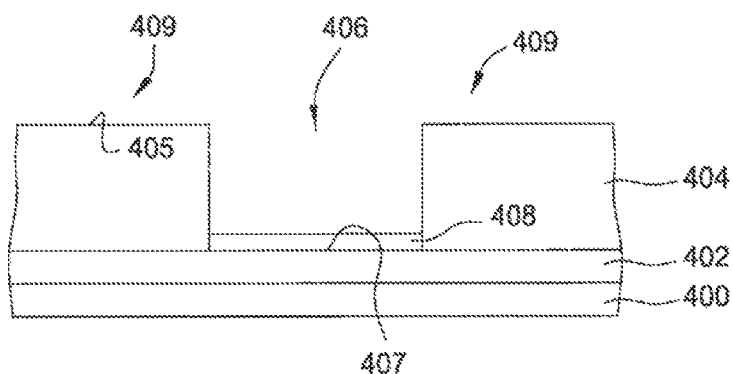

At block 306, a protective layer 408 is selectively deposited in the via 406 over the surface of the metal layer 402, as shown in FIG. 4C. The protective layer 408 may be deposited using CVD, ALD, or other suitable processes. In one embodiment, the protective layer 408 may be made from a material that is resistant to a halogen containing material. Such suitable materials, include, but are not limited to, Ru, TiN, TaN, or RuTiN. The protective layer 408 acts as a barrier to prevent reaction between a halogen containing material and the underlying metal layer 402.

Figure 4D:
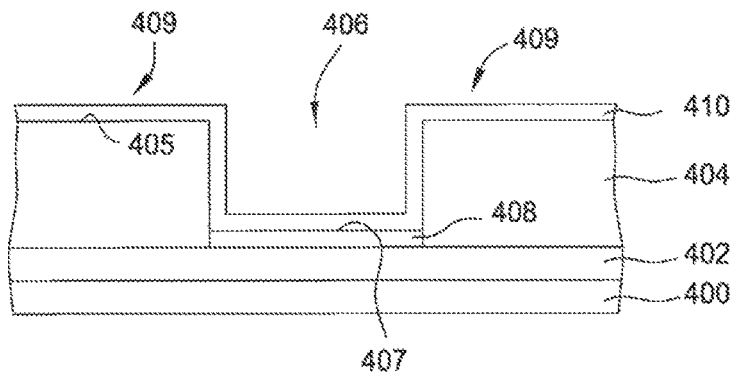

At block 308, a barrier layer 410 is deposited over the surface of the protective layer 408, and over the surface of the dielectric material 404, as shown in FIG. 4D. The barrier layer 410 may be deposited using PVD, ALD, CVD, or other suitable processes. The barrier layer 410 may be deposited using halogen containing precursors, such as a chlorine containing precursor or a fluorine containing precursor. The barrier layer 410 deposited using halogen containing precursors may be comprised of materials, such as, but not limited to, Ta, TaN, or alloyed Ta (e.g. TiTa, TaAl). The barrier layer 410 prevents diffusion of a metal into the surrounding dielectric material 404. The barrier layer 410 also provides an adhesive layer on the surrounding dielectric material 404 onto which the metal can be deposited.

Figure 4E:
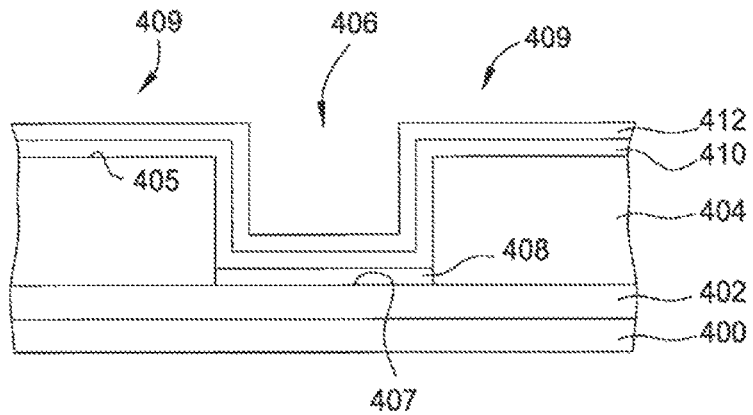

At block 310, an optional liner layer 412 may be deposited over the surface of the barrier layer 410, as shown in FIG. 4E. The liner layer 412 may be deposited using PVD, ALD, CVD, or other suitable processes. Additionally, the liner layer 412 may be deposited in the same chamber as the barrier layer 410. The liner layer 412 may be copper, ruthenium, or any other suitable material.

Figure 4F:
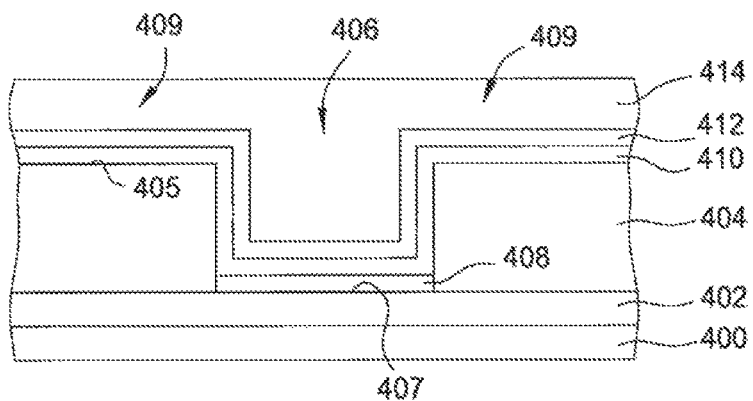

At block 312, the via 406 is filled with a metal 414, as illustrated in FIG. 4F. The metal 414 may be deposited in the via 406 by PVD, ALD, CVD, ECD, or other suitable processes. The metal 414 may be a conductive material, such as, but not limited to, copper (Cu) or cobalt (Co).

Figure 4G:
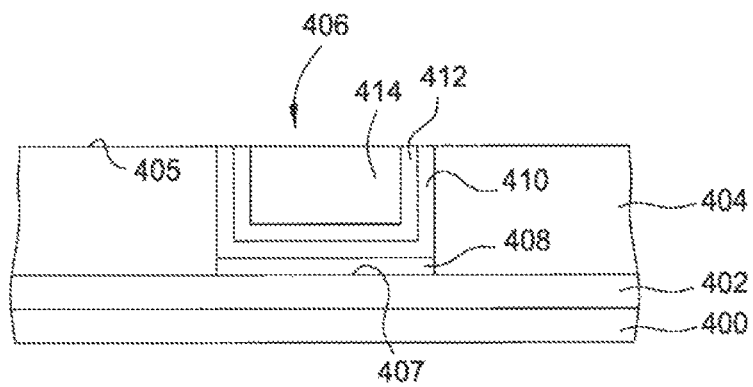

At block 314, the portion of the metal 414 which is formed over the field 409 of the substrate 400 may be removed using either chemical mechanical polishing as shown in FIG. 4G. The metal filled via 406 remains with the liner layer 412, the barrier layer 410, and the protective layer 408 formed between the metal 414 and the metal layer 402, following removal of the metal 414 from above the field the dielectric material 404.

Figure 5:
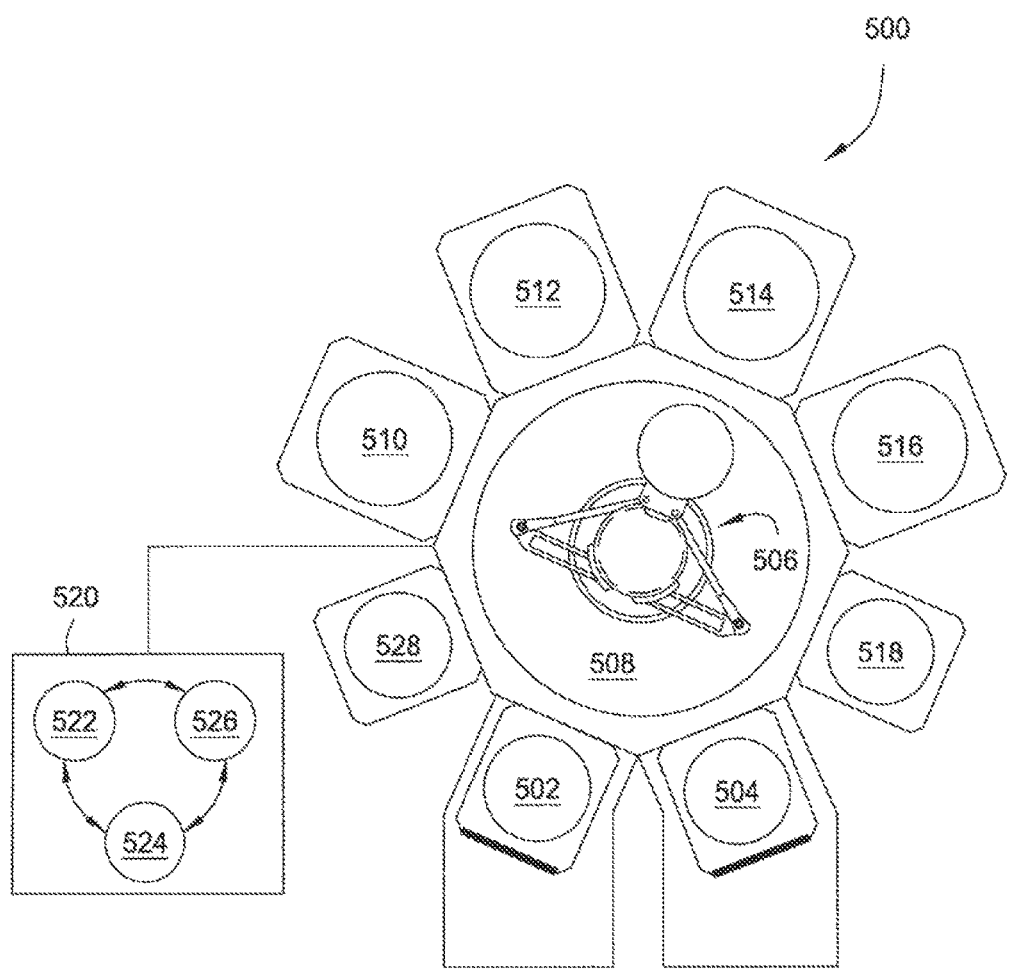
FIG. 5 illustrate a schematic view of one embodiment of a processing system configured to carry out the methods according to FIG. 1 and FIG. 3.

FIG. 5 depicts a multi-chamber processing system 500. The processing system 500 may include load lock chambers 502, 504, robot 506, a transfer chamber 508, processing chambers 510, 512, 514, 516, 518, 528 and controller 520. The load lock chambers 502, 504 allow for the transfer of substrates (not shown) into and out of the processing system 500. Load lock chambers 502, 504 may pump down the substrates introduced into the processing system 500 to maintain a vacuum seal. The robot 506 may transfer the substrates between load lock chambers 502, 504 and the processing chambers 510, 512, 514, 516, 518, and 528. The robot 506 may also transfer the substrates between the load lock chambers 502, 504, and the transfer chamber 508.

Each processing chamber 512, 514, 516, 518 and 528 may be outfitted to perform a number of substrate operations such as ALD, CVD, PVD, etch, pre-clean, de-gas, heat, orientation, and other substrate processes. Additionally, each processing chamber 512, 514, 516, 518, and 528 may be outfitted to respectfully deposit a protective layer, a barrier layer, a liner layer, and a metal layer.

The controller 520 may be used to operate all aspects of the processing system 500, such as the methods disclosed in FIG. 1 and FIG. 3. For example, the controller 520 may be configured to control the method of forming a metal interconnect on a substrate. The controller 520 includes a programmable central processing unit (CPU) 522 that is operable with a memory 524 and a mass storage device, an input control unit, and a display unit (not shown), such as power supplies, clocks, cache, input/output (I/O) circuits, and the like, coupled to the various components of the processing system 500 to facilitate control of the substrate processing. The controller 520 also includes hardware for monitoring substrate processing through sensors in the processing system 500, including sensors monitoring the precursor, process gas and purge gas flow. Other sensors that measure system parameters such as substrate temperature, chamber atmosphere pressure and the like may also provide information to the controller 520.

To facilitate control of the processing system 500 described above, the CPU 522 may be one of any form of general purpose computer processor that can be used in an industrial setting, such as a programmable logic controller (PLC), for controlling various chambers and sub-processors. The memory 524 is coupled to the CPU 522 and the memory 524 is non-transitory and may be one or more of readily available memory such as random access memory (RAM), read only memory (ROM), floppy disk drive, hard disk, or any other form of digital storage, local or remote. Support circuits 526 are coupled to the CPU 522 for supporting the processor in a conventional manner. Charged species generation, heating, and other processes are generally stored in the memory 524, typically as a software routine. The software routine may also be stored and/or executed by a second CPU (not shown) that is remotely located from the hardware being controlled by the CPU 522.

The memory 524 is in the form of computer-readable storage media that contains instructions, that when executed by the CPU 522, facilitates the operation of the processing system 500. The instructions in the memory 524 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Example 1

The following example may be carried out using the processing chamber described in FIG. 5. A substrate having a carbon containing silicon oxide layer formed over a conductive layer is used to form an interconnect according to one embodiment. The conductive layer in this example is fabricated from copper. A via is etched through the carbon containing silicon oxide layer, from the top surface of the carbon containing silicon oxide layer to the top surface of the copper layer to expose the copper layer. A robot moves the substrate from the load lock chamber to a first processing chamber for de-gas. The robot moves the substrate from the de-gas chamber to a second processing chamber for a pre-clean process after the de-gas process. The de-gas and pre-clean processes ensure that the substrate is free from any native oxides.

The robot transports the substrate to a second processing chamber for deposition of the protective layer. In the protective layer processing chamber, a ruthenium layer is deposited on the surface of the dielectric layer and in the via. The ruthenium layer acts as a protective layer to prevent reaction of the chlorine precursor (used in the deposition of the barrier layer) with the underlying copper metal. The ruthenium layer prevents such undesirable reaction because ruthenium is resistant to reaction with chlorine. The ruthenium layer is deposited using a CVD process. The thickness of the ruthenium layer may be between 1 nm and 5 nm.

The robot moves the substrate from the protective layer processing chamber to the barrier layer processing chamber, after the deposition of the ruthenium protective layer is complete. The barrier layer is deposited over the surface of the ruthenium protective layer using a CVD process. A chlorine precursor gas is used for deposition of the barrier layer, where the barrier layer is a Ta film. The substrate may remain in the barrier layer processing chamber for deposition of a liner layer on the top surface of the barrier layer.

The robot may move the substrate from the barrier layer processing chamber to a processing chamber for deposition of a copper seed. The copper may be deposited to fill the via using a CVD process. The top surface of the liner layer on top of the dielectric material may also be layered with the copper material.

The substrate may be moved into a chemical mechanical polishing system to planarize the copper layer back to the liner layer, the liner layer back to the barrier layer, the barrier layer back to the protective layer, and the protective layer back to the dielectric material.

Example 2

The following example may be carried out using the processing chamber described in FIG. 5. A substrate having a carbon containing silicon oxide layer formed over a conductive layer is used to form an interconnect according to one embodiment. The conductive layer in this example is fabricated from copper. A via is etched through the carbon containing silicon oxide layer from a top surface of the carbon containing silicon oxide layer to the top surface of the copper layer to expose the copper layer. A robot moves the substrate from the load lock chamber to a first processing chamber for de-gas. The robot moves the substrate from the de-gas chamber to a second processing chamber for a pre-clean process, after the de-gas process is complete. The de-gas and pre-clean processes ensure that the substrate is free from any native oxides.

The robot transports the substrate to a second processing chamber for deposition of the protective layer. In the protective layer processing chamber, a titanium nitride (TiN) layer is deposited on the surface of the dielectric layer and in the via. The TiN layer acts as a protective layer to prevent reaction of the fluorine precursor (used in the deposition of the barrier layer) with the underlying copper metal. The TiN layer prevents such undesirable reaction because TiN is resistant to reaction with fluorine. The TiN layer is deposited on the substrate using a CVD process. The thickness of the TiN layer may be between 1 nm and 5 nm.

The robot moves the substrate from the protective layer processing chamber to the barrier layer processing chamber, after deposition of the TiN protective layer is complete. The barrier layer is deposited over the surface of the TiN protective layer using a CVD process. A fluorine precursor gas is used for deposition of the barrier layer, where the barrier layer is a Ta film. The substrate may remain in the barrier layer processing chamber for deposition of a liner layer on the top surface of the barrier layer.

The robot may move the substrate from the barrier layer processing chamber to a processing chamber for deposition of a copper seed. The copper may be deposited to fill the via using a CVD process. The top surface of the liner layer on top of the dielectric material may also be layered with the copper material.

The substrate may be moved into a chemical mechanical polishing system to planarize the copper layer back to the liner layer, the liner layer back to the barrier layer, the barrier layer back to the protective layer, and the protective layer back to the dielectric material.

Example 3

The following example may be carried out using the processing chamber described in FIG. 5. A substrate having a carbon containing silicon oxide layer formed over a conductive layer is used to form an interconnect according to one embodiment. The conductive layer in this example is fabricated from cobalt. A via is etched through the carbon containing silicon oxide layer from the top surface of the carbon containing silicon oxide layer to the top surface of the cobalt layer to expose the cobalt layer. A robot moves the substrate from the load lock chamber to a first processing chamber for de-gas. The robot moves the substrate from the de-gas chamber to a second processing chamber for a pre-clean process, after the de-gas process is complete. The de-gas and pre-clean processes ensure that the substrate is free from any native oxides.

The robot transports the substrate to a second processing chamber for deposition of the protective layer. In the protective layer processing chamber, a ruthenium layer is selectively deposited in the via, on the surface of the cobalt layer. The ruthenium layer acts as a protective layer to prevent reaction of the chlorine precursor (used in the deposition of the barrier layer) with the underlying cobalt metal. The ruthenium layer prevents such undesirable reaction because ruthenium is resistant to reaction with chlorine. The selective deposition increases the volume of cobalt because the protection material on the side walls of the via is decreased through the selective deposition. The ruthenium layer is deposited on the substrate using a CVD process. The thickness of the ruthenium layer may be between 1 nm to 5 nm.

After the deposition of the ruthenium protective layer is complete, the robot moves the substrate from the protective layer processing chamber to the barrier layer processing chamber. The barrier layer is deposited over the surface of the ruthenium protective layer and over the surface of the dielectric material using a CVD process. A chlorine precursor gas is used for deposition of the barrier layer, where the barrier layer is a Ta film. The substrate may remain in the barrier layer processing chamber for deposition of a liner layer on the top surface of the barrier layer.

The robot may move the substrate from the barrier layer processing chamber to a processing chamber for deposition of a cobalt seed. The cobalt may be deposited to fill the via using a CVD process. The top surface of the liner layer on top of the dielectric material may also be layered with the cobalt material.

The substrate may be moved into a chemical mechanical polishing system to planarize the cobalt layer back to the liner layer, the liner layer back to the barrier layer, the barrier layer back to the protective layer, and the protective layer back to the dielectric material.

Example 4

The following example may be carried out using the processing chamber described in FIG. 5. A substrate having a carbon containing silicon oxide layer formed over a conductive layer is used to form an interconnect according to one embodiment. The conductive layer in this example is copper. A via is etched through the carbon containing silicon oxide layer, from a top surface to the carbon containing silicon oxide layer to the top surface of the copper layer to expose the copper layer. A robot moves the substrate from the load lock chamber to a first processing chamber for de-gas. The robot moves the substrate from the de-gas chamber to a second processing chamber for a pre-clean process, after the de-gas process is complete. The de-gas and pre-clean processes ensure that the substrate is free from any native oxides.

The robot transports the substrate to a second processing chamber for deposition of the protective layer. In the protective layer processing chamber, a ruthenium layer is selectively deposited in the via on the surface of the exposed copper metal layer. The ruthenium layers acts as a protective layer to prevent reaction of the chlorine precursor (used in the deposition of the barrier layer) with the underlying copper metal. The ruthenium layer prevents such undesirable reaction because ruthenium is resistant to reaction with chlorine. The ruthenium layer is deposited using a PVD process. A collimator is disposed in the PVD chamber so that the ruthenium may be selectively deposited on the exposed copper surface. The volume of copper is thus, increased, because the protection material on the side walls of the via is decreased. The thickness of the ruthenium layer may be between 1 nm to 5 nm.

The robot moves the substrate from the protective layer processing chamber to the barrier layer processing chamber, when the deposition of the ruthenium protective layer is complete. The barrier layer is deposited over the surface of the ruthenium protective layer and over the surface of the dielectric material using a CVD process. A chlorine precursor gas is used for deposition of the barrier layer, where the barrier layer is a Ta film. The substrate may remain in the barrier layer processing chamber for deposition of a liner layer on the top surface of the barrier layer.

The robot may move the substrate from the barrier layer processing chamber to a processing chamber for deposition of a copper seed. The copper may be deposited to fill the via using a CVD process. The top surface of the liner layer on top of the dielectric material may also be layered with the copper material.

The substrate may be moved into a chemical mechanical polishing system to planarize the copper layer back to the liner layer, the liner layer back to the barrier layer, the barrier layer back to the protective layer, and the protective layer back to the dielectric material.

Example 5

The following example may be carried out using the processing chamber described in FIG. 5. A substrate having a carbon containing silicon oxide layer formed over a conductive layer is used to form an interconnect according to one embodiment. The conductive layer in this example is copper. A via is etched through the carbon containing silicon oxide layer, from a top surface to the carbon containing silicon oxide layer to the top surface of the copper layer to expose the copper layer. A robot moves the substrate from the load lock chamber to a first processing chamber for de-gas. The robot moves the substrate from the de-gas chamber to a second processing chamber for a pre-clean process, after the de-gas process is complete. The de-gas and pre-clean processes ensure that the substrate is free from any native oxides.

The robot transports the substrate to a second processing chamber for deposition of the protective layer. In the protective layer processing chamber, a ruthenium layer is selectively deposited in the via on the surface of the exposed copper metal layer. The ruthenium layers acts as a protective layer to prevent reaction of the chlorine precursor (used in the deposition of the barrier layer) with the underlying copper metal. The ruthenium layer prevents such undesirable reaction because ruthenium is resistant to reaction with chlorine. The ruthenium layer is deposited using a PVD process. A collimator is disposed in the PVD chamber so that the copper may be selectively deposited on the exposed copper surface. The volume of copper is thus, increased, because the protection material on the side walls of the via is decreased. The thickness of the ruthenium layer may be between 1 nm to 5 nm.

The robot moves the substrate from the protective layer processing chamber to the barrier layer processing chamber, when the deposition of the ruthenium protective layer is complete. The barrier layer is deposited over the surface of the ruthenium protective layer and over the surface of the dielectric material using a CVD process. A chlorine precursor gas is used for deposition of the barrier layer, where the barrier layer is a Ta film. The substrate may remain in the barrier layer processing chamber for deposition of a liner layer on the top surface of the barrier layer.

The robot may move the substrate from the barrier layer processing chamber to a processing chamber for deposition of a cobalt seed. The cobalt may be deposited to fill the via using a CVD process. The top surface of the liner layer on top of the dielectric material may also be layered with the cobalt material.

The substrate may be moved into a chemical mechanical polishing system to planarize the cobalt back to the liner layer, the liner layer back to the barrier layer, the barrier layer back to the protective layer, and the protective layer back to the dielectric material.

Example 6

The following example may be carried out using the processing chamber described in FIG. 5. A substrate having a carbon containing silicon oxide layer formed over a conductive layer is used to form an interconnect according to one embodiment. The conductive layer in this example is cobalt. A via is etched through the carbon containing silicon oxide layer, from a top surface to the carbon containing silicon oxide layer to the top surface of the cobalt layer to expose the cobalt layer. A robot moves the substrate from the load lock chamber to a first processing chamber for de-gas. The robot moves the substrate from the de-gas chamber to a second processing chamber for a pre-clean process, after the de-gas process is complete. The de-gas and pre-clean processes ensure that the substrate is free from any native oxides.

The robot transports the substrate to a second processing chamber for deposition of the protective layer. In the protective layer processing chamber, a ruthenium layer is selectively deposited in the via on the surface of the exposed copper metal layer. The ruthenium layers acts as a protective layer to prevent reaction of the chlorine precursor (used in the deposition of the barrier layer) with the underlying cobalt metal. The ruthenium layer prevents such undesirable reaction because ruthenium is resistant to reaction with chlorine. The ruthenium layer is deposited using a PVD process. A collimator is disposed in the PVD chamber so that the ruthenium may be selectively deposited on the exposed cobalt surface. The volume of cobalt is thus, increased, because the protection material on the side walls of the via is decreased. The thickness of the ruthenium layer may be between 1 nm to 5 nm.

The robot moves the substrate from the protective layer processing chamber to the barrier layer processing chamber, when the deposition of the ruthenium protective layer is complete. The barrier layer is deposited over the surface of the ruthenium protective layer and over the surface of the dielectric material using a CVD process. A chlorine precursor gas is used for deposition of the barrier layer, where the barrier layer is a Ta film. The substrate may remain in the barrier layer processing chamber for deposition of a liner layer on the top surface of the barrier layer.

The robot may move the substrate from the barrier layer processing chamber to a processing chamber for deposition of a copper seed. The copper may be deposited to fill the via using a CVD process. The top surface of the liner layer on top of the dielectric material may also be layered with the copper material.

The substrate may be moved into a chemical mechanical polishing system to planarize the copper layer back to the liner layer, the liner layer back to the barrier layer, the barrier layer back to the protective layer, and the protective layer back to the dielectric material.

Figure 6:
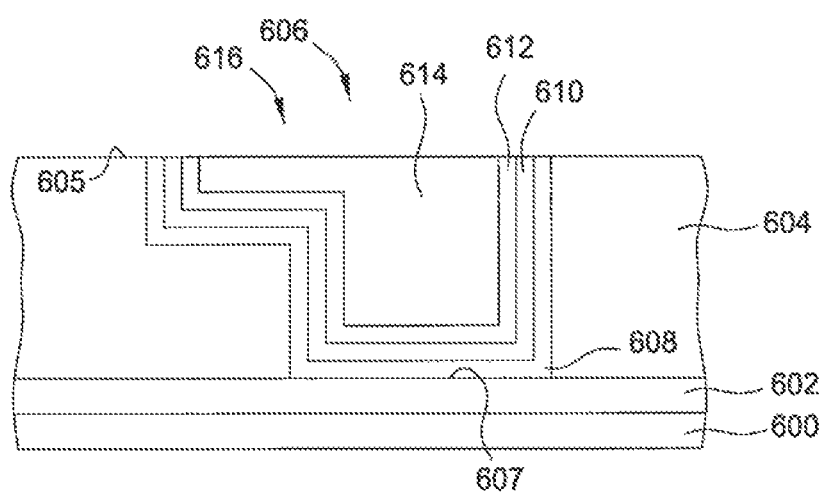
FIG. 6 illustrates a cross sectional view of a metal interconnect on a substrate, according to one embodiment.

The preceding embodiments depict a process flow that implements a single damascene structure. It is also contemplated that a single process flow can be implemented for a dual damascene structure. FIG. 6 illustrates one embodiment of the dual damascene structure.

The dual damascene structure implements a process where a via 606 and/or trench 616 are etched into a dielectric material 604. The dielectric material 604 is deposited onto a metal layer 602. The metal layer 602 is formed on a substrate 600. A protective layer 608 may be deposited over the dielectric material 604 and into the via 606 and the trench 616 on a top surface 607 of the metal layer 602. A barrier layer 610 may be deposited over the protective layer 608. An optional liner layer 612 may be deposited over the barrier layer 610. A metal layer may be deposited over the optional liner layer 612. The metal layer 614 is used to fill the via 606 and the trench 616. The layers 608-614 may be removed from a top surface 605 of the dielectric material 604, the via 606, and trench 616 using a chemical mechanical process.

While the foregoing is directed to specific embodiments, other and further embodiments may be devised without departing from the basis scope thereof, and the scope thereof is determined by the claims that follow.

What is claimed is:

1. A method of forming an interconnect on a substrate comprising:

positioning a substrate in a first processing chamber of a multi-chamber processing system;

depositing a dielectric material on top of a first metal layer formed on the substrate, the dielectric material in contact with the first metal layer;

forming a via through the dielectric material to expose a portion of the first metal layer;

transferring the substrate from the first processing chamber to a second processing chamber of the multi-chamber processing system;

selectively forming a protective layer of substantially uniform thickness on the entirety of the portion of the first metal layer that was exposed and sidewalls of the via in the second processing chamber, the protective layer formed on the dielectric material, wherein the protective layer is resistant to a halogen based precursor;

transferring the substrate from the second processing chamber to a third processing chamber of the multi-chamber processing system;

forming a barrier layer on the protective layer using the halogen based precursor in the third processing chamber;

transferring the substrate from the third processing chamber to a fourth processing chamber of the multi-chamber processing system; and depositing a second metal layer over the barrier layer in the fourth processing chamber.

2. The method of claim 1, further comprising:
depositing a liner layer over the barrier layer.

3. The method of claim 1, wherein the protective layer comprises:
ruthenium.

4. The method of claim 3, wherein the barrier layer is deposited using chlorine based precursors.

5. The method of claim 1, wherein the protective layer comprises:
titanium nitride.

6. The method of claim 5, wherein the barrier layer is deposited using fluorine based precursors.

7. The method of claim 1, wherein the protective layer comprises one of:
ruthenium, titanium nitride, tantalum nitride, or ruthenium titanium nitride.

8. The method of claim 1, wherein the protective layer comprises ruthenium titanium nitride.

9. A method for forming an interconnect on a substrate comprising:
positioning a substrate in a first processing chamber of a multi-chamber processing system;

depositing a dielectric material on top of a first metal layer formed on the substrate, the dielectric material in contact with the first metal layer;

forming a via through the dielectric material to expose a portion of the first metal layer;

transferring the substrate from the first processing chamber to a second processing chamber of the multi-chamber processing system;

selectively forming a protective layer of substantially uniform thickness on the entirety of the portion of the first metal layer that was exposed through the dielectric material in the second processing chamber, wherein the protective layer is resistant to a halogen based precursor;

transferring the substrate from the second processing chamber to a third processing chamber of the multi-chamber processing system;

forming a barrier layer on the protective layer using the halogen based precursor in the third processing chamber;

transferring the substrate from the third processing chamber to a fourth processing chamber of the multi-chamber processing system; and depositing a second metal layer over the barrier layer in the fourth processing chamber.

10. The method of claim 9, further comprising:
depositing a liner layer over the barrier layer.

11. The method of claim 9, wherein the protective layer comprises:
ruthenium.

12. The method of claim 11, wherein the barrier layer is deposited using chlorine based precursors.

13. The method of claim 9, wherein the protective layer comprises:
titanium nitride.

14. The method of claim 13, wherein the barrier layer is deposited using fluorine based precursors.

15. The method of claim 9, wherein the protective layer comprises one of:
ruthenium, titanium nitride, tantalum nitride, or ruthenium titanium nitride.

16. The method of claim 9, wherein the protective layer comprises ruthenium titanium nitride.

17. A method of forming an interconnect on a substrate comprising:
positioning a substrate in a first processing chamber of a multi-chamber processing system;

depositing a dielectric material on top of a first metal layer formed on the substrate, the dielectric material in contact with the first metal layer;

forming a via through the dielectric material to expose a portion of the first metal layer;

transferring the substrate from the first processing chamber to a second processing chamber of the multi-chamber processing system;

selectively forming a protective layer of substantially uniform thickness on the entirety of the portion of the first metal layer that was exposed and sidewalls of the via in the second processing chamber, the protective layer formed on the dielectric material, wherein the protective layer is resistant to a halogen based precursor, and wherein the protective layer comprises ruthenium titanium nitride and the thickness is between about 1 nanometer and about 5 nanometers;

transferring the substrate from the second processing chamber to a third processing chamber of the multi-chamber processing system;

forming a barrier layer on the protective layer using the halogen based precursor in the third processing chamber;

transferring the substrate from the third processing chamber to a fourth processing chamber of the multi-chamber processing system; and depositing a second metal layer over the barrier layer in the fourth processing chamber.

18. The method of claim 17, further comprising:
depositing a liner layer over the barrier layer.

19. The method of claim 18, wherein the depositing the liner layer over the barrier layer is performed in the third processing chamber.

20. The method of claim 17, wherein the dielectric layer material comprises a carbon-containing silicon oxide material.

* * * * *